United States Patent [19]

Proskow

[11] 4,272,608

[45] Jun. 9, 1981

[54] PHOTOSENSITIVE COMPOSITIONS CONTAINING THERMOPLASTIC IONOMERIC ELASTOMERS USEFUL IN FLEXOGRAPHIC PRINTING PLATES

[75] Inventor: Stephen Proskow, Wilmington, Del.

[73] Assignee: E. I. Du Pont de Nemours and Company, Wilmington, Del.

[21] Appl. No.: 27,445

[22] Filed: Apr. 5, 1979

[51] Int. Cl.$^3$ .............................................. G03C 1/68
[52] U.S. Cl. ................................... 430/288; 430/281; 430/286; 430/905; 430/916
[58] Field of Search ................... 96/115 R, 115 P, 67; 430/286, 288, 905, 916, 281

[56] References Cited

U.S. PATENT DOCUMENTS

| | | | |
|---|---|---|---|
| 3,016,297 | 1/1962 | Mochel et al. | 96/35 |
| 3,787,212 | 1/1974 | Hemsch et al. | 96/115 R |
| 3,825,430 | 7/1974 | Kurka | 96/115 R |

FOREIGN PATENT DOCUMENTS

| | | | |
|---|---|---|---|
| 614181 | 2/1961 | Canada | 96/115 P |
| 2720228 | 12/1977 | Fed. Rep. of Germany | 96/115 R |
| 53-137704 | 12/1978 | Japan . | |
| 1179252 | 1/1970 | United Kingdom | 96/115 R |

OTHER PUBLICATIONS

Brown: Rubber Chem. Tech., 36, pp. 931–962, (1963).

*Primary Examiner*—Won H. Louie, Jr.
*Attorney, Agent, or Firm*—James A. Costello

[57] ABSTRACT

Photosensitive, elastomeric compositions comprising
(1) a high molecular weight carboxylated butadiene/acrylonitrile copolymer in which at least about 25% of the carboxyl groups are neutralized with a metal cation of Groups IIA or IIB of the Periodic Table,
(2) an ethylenically unsaturated monomer, and
(3) a free radical generating system, having outstanding properties as photosensitive elements for flexographic printing plates.

11 Claims, No Drawings

4,272,608

PHOTOSENSITIVE COMPOSITIONS CONTAINING THERMOPLASTIC IONOMERIC ELASTOMERS USEFUL IN FLEXOGRAPHIC PRINTING PLATES

DESCRIPTION

Technical Field

This invention relates to photosensitive compositions comprising a high molecular weight butadiene/acrylonitrile copolymer containing carboxyl groups cross-linked via selected metal ions, and the use of such compositions as the photosensitive element in flexographic printing plates.

One object of the present invention is to provide a photosensitive elastomeric composition for use in a flexographic printing plate that can be processed in aqueous or semiaqueous basic solution. Another object is to provide melt-extrudable, elastomeric photopolymerizable compositions which exhibit excellent solvent resistance to a wide variety of inks, especially water, alcohol and hydrocarbon-based inks. A further object is to provide flexographic printing plates which exhibit increased clarity, reduced tackiness, and improved toughness and resilience.

BACKGROUND ART

Copolymer binders, e.g., butadiene/acrylonitrile, which contain carboxyl groups have been employed previously in photosensitive compositions. U.S. Pat. No. 3,825,430 to Kurka describes a light-sensitive composition containing a continuous phase of a light-sensitive organic material and a discontinuous phase of a finely divided, elastomeric organic compound uniformly distributed through the continuous phase, e.g., a carboxyl-containing, high molecular weight butadiene/acrylonitrile copolymer. The discontinuous phase generally represents 5–50% by weight of the total composition.

Canadian Patent No. 614,181 to McGraw describes a photopolymerizable composition comprising at least 40% by weight of a butadiene homopolymer or copolymer binder including butadiene/acrylonitrile and butadiene/methacrylic acid copolymers, at least 10% by weight of an addition-polymerizable ethylenically unsaturated compound and 0.001 to 10% by weight of polymerization initiator.

U.S. Pat. No. 4,177,074 discloses photosensitive, elastomeric compositions containing (1) a high molecular weight butadiene/acrylonitrile copolymer which preferably contains carboxyl groups, (2) a low molecular weight butadiene polymer, (3) an ethylenically unsaturated monomer, and (4) a free-radical generating system. The compositions have outstanding properties as photosensitive coatings for flexographic printing plates.

German Patent Specification No. 2,720,228 to Japan Synthetic Rubber Company, published Dec. 1, 1977, discloses photosensitive compositions consisting of (I) a copolymer of (a) a conjugated diene, (b) an $\alpha,\beta$-ethylenically unsaturated carboxylic acid or anhydride, and optionally (c) a monoolefinically-unsaturated compound, e.g., a butadiene/acrylonitrile copolymer; (II) a photosensitizer and/or light-sensitive cross-linking agent; and (III) a photopolymerizable unsaturated monomer, useful for flexographic relief printing plates. The carboxyl groups of the copolymer may be neutralized with an alkali metal cation or amine cation. Such neutralized compositions are readily developable in water after exposure to radiation. No specific examples of a neutralized carboxyl-containing butadiene/acrylonitrile copolymer are employed, and neutralization with a Group IIA or IIB metal cation is not disclosed.

U.S. Pat. No. 3,787,212 to Heimsch et al describes photosensitive compositions containing an acrylonitrile/diene interpolymer and an aromatic ketone sensitizer for use in photoresist applications. There is no disclosure in Heimsch et al of a composition useful for the manufacture of flexographic printing plates which contain as the binder a carboxylated high molecular weight butadiene/acrylonitrile copolymer in which some or all of the carboxylic acid protons are exchanged for metal ions of Group IIA or IIB.

U.S. Pat. No. 3,016,297 to Mochel et al describes cross-linking of photopolymerizable compositions via chelation with a polyvalent metal, usually employing electron donor groups located 1,3 with respect to one another along a polymer chain. Carboxyl-containing butadiene/acrylonitrile copolymer binders are not disclosed and no specific examples are given which illustrate use of a carboxyl electron donor group.

Cross-linking of carboxyl-containing butadiene elastomers with metal ions of Groups 1–3 of the Periodic Table to give thermally reversible cross-links is reviewed by Brown in Rubber Chem. Tech., 36, p. 931–962 (1963); see also British Patent No. 1,179,252 to Locke and Hawkins which discloses cross-linking polymers containing carboxyl groups by a thermally reversible process using metal ions of Groups 1–3.

DISCLOSURE OF INVENTION

For further comprehension of the invention, and of the objects and advantages thereof reference may be made to the following description and to the appended claims in which the various novel features of the invention are more particularly set forth.

The present invention comprises a photosensitive, elastomeric composition which comprises, based on the total composition, (1) about 40 to about 90% by weight of a high molecular weight butadiene/acrylonitrile copolymer having a number average molecular weight of about 20,000 to about 75,000, an acrylonitrile content of about 10 to about 50% by weight, and a carboxyl content of about 2 to about 15% by weight, about 25 to about 100 mole % of said carboxyl groups being neutralized with a metal cation of Groups IIA or IIB of the Periodic Table of the Elements;

(2) about 2 to about 40% by weight of a nongaseous, ethylenically unsaturated compound containing at least one terminal ethylenic group, said compound being capable of forming a high polymer by free-radical initiated, chain-propagating addition polymerization and being compatible with copolymer (1);

(3) about 0.001 to about 10% by weight of a radiation-sensitive, free-radical generating system, activatible by actinic radiation, which initiates polymerization of the unsaturated compound.

The photosensitive, elastomeric compositions of this invention differ from the photosensitive, elastomeric compositions of U.S. Pat. No. 4,177,074, in that carboxyl groups attached to the high molecular weight butadiene/acrylonitrile copolymer binder are neutralized with a metal cation of Groups IIA or IIB of the Periodic Table. When at least about 25 mole percent and preferably about 100 mole percent of the available carboxyl groups are so neutralized, a significant improvement in physical properties of the compositions is obtained compared with unneutralized compositions.

It is believed that neutralization of the carboxyl groups effects ionic cross-linking of the polymer chains of the binder and that such cross-links are thermally reversible. Hence the photosensitive compositions of this invention possess certain mechanical properties similar to those of conventional reinforced rubber vulcanizates, such as high tensile strength and rapid return from high extension, as well as certain properties of conventional thermoplastics, such as reversible transition to a melt with a moderate increase in temperature. Such features allow the easy preparation and manipulation of the photosensitive composition into useful elements comprising a substrate bearing a layer of the photosensitive composition without affecting solubility in processing solvents. Furthermore, when elements of this invention are imagewise exposed to actinic radiation, the exposed areas become insoluble and result in tough, shaped, elastomeric reliefs with subsequent solvent removal of unexposed portions of the composition. The resulting reliefs also exhibit superior resistance to a variety of solvents including water, alcohol and hydrocarbons.

In addition, the compositions of the invention before polymerization retain their solubility in aqueous or semiaqueous basic solutions. Photosensitive elements prepared from such compositions can be exposed and developed by washing with aqueous or aqueous/organic basic solutions to produce a photoimage. Use of such aqueous basic developing solutions avoids the use of organic solvents which are costly and present fire, health and ecological hazards.

This invention provides photosensitive elements for producing flexographic printing plates of uniform printing height from relatively inexpensive materials and with a marked reduction in labor requirements over the conventional procedure. Both the relief and printed images obtained show fidelity to the original transparency both in small details and in overall dimensions even when the element is imagewise exposed on a cylindrical support. The reliefs have high impact strength, are tough and abrasion-resistant, and have broad ink compatibility, i.e., have good compatibility with a wide range of inks, e.g., water-based inks, hydrocarbon inks and alcohol-based inks. The hardness of the reliefs and the ease of development can be easily changed by varying components and component concentrations.

One of the essential ingredients in the compositions of this invention is a polymeric binder comprising a high molecular weight butadiene/acrylonitrile copolymer having a number average molecular weight in the range of about 20,000 to about 75,000, and preferably in the range of about 25,000 to about 50,000. The acrylonitrile content of these copolymers varies from about 10 to about 50% by weight, and preferably from about 15 to about 40%. The copolymer also has a carboxyl content of about 2 to about 15% by weight, and preferably about 3 to about 10% by weight.

To effectively provide for ionic cross-linking of the polymeric binder, at least about 25 mole percent and preferably about 50 to about 100 mole percent of the carboxyl groups of the binder are neutralized with a metal cation of Groups IIA or IIB of the Periodic Table. A copy of the Periodic Table of the Elements can be found in the third edition of the text, Cotton and Wilkinson, "Advanced Inorganic Chemistry", Interscience Publishers, New York, 1972. To effect the neutralization, a suitable compound containing the desired metal cation is preferably introduced into the photosensitive composition at the time of mixing. Alternatively, the carboxyl groups of the polymeric binder may be neutralized before mixing the binder with the other components of the composition. Suitable metal compounds for use in preparing the ionically cross-linked binders of the invention include metal alkoxides, metal hydroxides, metal oxides, metal salts of relatively weak carboxylic acids, e.g. metal acetates including zinc acetate, etc., metal salts of an acid readily eliminated from the cross-linking site, and metal acetoacetates. It is also feasible to employ a mixture of two or more metals to effect cross-linking, e.g., a mixture of zinc and magnesium acetoacetates.

Preferred as metal cations are zinc, magnesium and calcium.

The high molecular weight copolymer should be present in the amount of about 40 to about 90% by weight, based on the total composition, and preferably about 50 to about 80%. At least about 40% by weight of the high molecular weight copolymer is generally necessary to give adequate flexibility and physical integrity to photosensitive elements, particularly for flexographic plates.

Carboxyl groups may be incorporated into the high molecular weight copolymer by addition to the polymerization process of a carboxyl-containing termonomer, e.g., methacrylic acid, or a termonomer which is convertible to a carboxyl-containing group, e.g., maleic anhydride or metal methacrylate. Such polymers are available commercially from several sources, e.g., from the B. F. Goodrich Company under the trade name Hycar ®.

The carboxyl contents of these copolymers are calculated from the equivalents of carboxyl groups per hundred parts of rubber (EPHR) times the molecular weight of the carboxyl group (45) in accordance with the equation:

$$\% \text{ carboxyl} = \text{EPHR} \times 45$$

Another essential ingredient of the photosensitive compositions of this invention is a nongaseous, ethylenically unsaturated compound containing at least one terminal ethylenic group. This compound should be capable of forming a high polymer by free-radical initiated chain-propagating addition polymerization and be compatible with the high molecular weight polymeric binder. One class of suitable ethylenically unsaturated compounds includes unsaturated esters of alcohols, especially such esters of alpha-methylene carboxylic acids and substituted alpha-methylene carboxylic acids, more especially such esters of alkylene polyols and polyalkylene polyols, and most especially alkylene polyol di- and tri-acrylates and polyalkylene polyol di- and tri-acrylates prepared from alkylene polyols of 2–15 carbon atoms or polyalkylene ether polyols or glycols of 1–10 ether linkages.

The following specific compounds are further illustrative of suitable ethylenically unsaturated compounds: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetramethacrylate, 1,3-propanediol diacrylate, 1,3-pentanediol dimethacrylate, p-α,α-dimethylbenzylphenyl acrylate, t-butyl acrylate, N,N-diethylaminoethyl acrylate, N,N-diethylaminoethyl methacrylate, 1,4-butanediol diacrylate, 1,6-hexanediol diacrylate, 1,10-decanediol diacrylate, 2,2-dimethylolpropane diacrylate, tripropylene glycol diacrylate, 2,2-di(p-hyroxyphenyl)propane diacrylate, 2,2-di(p-hydroxyphenyl)propane dimethacrylate, polyoxyethyl-2,2-di(p-hydroxyphenyl)propane dimethacrylate, polyoxypropyltrimethylolpropane triacrylate (molecular weight of 462), 1,4-butanediol dimethacrylate, 1,6-hexanediol dimethacrylate, 2,2,4-trimethyl-1,3-pentanediol dimethacrylate, 1-phenylethylene-1,2-dimethacrylate, trimethylolpropane trimethacrylate, triethylene glycol diacrylate, ethylene glycol acrylate phthalate, polyoxyethyltrimethylolpropane triacrylate, diacrylate and dimethacrylate esters of diepoxy polyethers derived from aromatic polyhydroxy compounds such as bisphenols, novolaks and similar compounds such as those described by Crary in U.S. Pat. No. 3,661,576, the bis-acrylates and methacrylates of polyethylene glycols of molecular weight 200–500, and the like.

Another class of suitable ethylenically unsaturated compounds includes the compounds disclosed by Martin and Barney in U.S. Pat. No. 2,927,022, e.g., those having a plurality of addition-polymerizable ethylenic linkages, particularly when present as terminal linkages, and especially those wherein at least one and preferably most of such linkages are conjugated with a double bonded carbon, including carbon doubly bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of alpha-methylene carboxylic acids, especially with alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(γ-methacrylamidopropoxy)ethane, beta-methacrylamidoethyl methacrylate, N-(beta-hydroxyethyl)-beta-(methacrylamido)ethyl acrylate, and N,N-bis(beta-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; diallyl fumarate; and the like.

Additional ethylenically unsaturated compounds which may be used include styrene and derivatives thereof, 1,4-diisopropenylbenzene, 1,3,5-triisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described by Crary in U.S. Pat. No. 3,661,576; polybutadiene and butadiene/acrylonitrile copolymers containing terminal and pendant vinyl groups; and unsaturated aldehydes, such as sorbaldehyde (2,4-hexadienal).

Ethylenically unsaturated compounds which are water soluble or contain carboxyl or other alkali-reactive groups are especially suitable with the aqueous basic-developable systems which are employed. In addition, the polymerizable, ethylenically unsaturated polymers of Burg, U.S. Pat. No. 3,043,805; Martin, U.S. Pat. No. 2,929,710; and similar materials may be used alone or mixed with other materials. Acrylic and methacrylic esters of adducts of ethylene oxide and polyhydroxy compounds such as those described by Cohen and Schoenthaler in U.S. Pat. No. 3,380,831 are also useful. The photocross-linkable polymers disclosed in Schoenthaler, U.S. Pat. No. 3,418,295, and Celeste, U.S. Pat. No. 3,448,089, may also be used.

When carboxyl-containing unsaturated compounds are employed, the carboxyl groups may also be neutralized with a metal cation of Groups IIA or IIB.

The amount of unsaturated compound added should be in the range of about 2 to about 40% by weight, based on the total composition. The specific amount of optimum results will vary depending on the particular copolymer used. Preferably the amount of unsaturated compound is in the range of about 10 to about 30%.

The third essential ingredient of the photosensitive compositions of this invention is a radiation-sensitive, free radical generating system. Practically any radiation-sensitive, free radical generating system which initiates polymerization of the unsaturated compound and does not excessively terminate the polymerization can be used in the photosensitive compositions of this invention. Because process transparencies transmit heat originating from conventional sources of actinic radiation, and since the photosensitive compositions are usually prepared under conditions resulting in elevated temperatures, the preferred free-radical generating compounds are inactive thermally below 85° C., and more preferably below 185° C. They should be dispersible in the composition to the extent necessary for initiating the desired polymerization or cross-linking under the influence of the amount of radiation absorbed in relatively short term exposures. These initiators are useful in amounts from about 0.001 to about 10% by weight, and preferably from about 0.1 to about 5% based on the total weight of the solvent-free photosensitive composition.

The free-radical generating system absorbs radiation within the range of about 2000 to about 8000 Å and has at least one component that has an active radiation absorption band with a molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or cross-linking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)-benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Pat. Nos. 997,396 and 1,047,569.

The imidazolyl dimers are used with a radical producing electron donor such as 2-mercaptobenzoxazole, Leuco Crystal Violet or tris(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863. Preferred as free-radical generating compounds are the benzoin ethers, particularly benzoin isobutyl ether, and benzil dimethyl ketal.

An optional ingredient in the compositions of this invention is a low molecular weight butadiene polymer having a number average molecular weight in the range of about 750 to about 10,000, and preferably in the range of about 1,000 to about 5,000. Optionally, the polymer has an acrylonitrile content of from 0 to about 50% by weight. When the polymer contains acrylonitrile groups, the acrylonitrile content is preferably in the range of about 10 to about 30%. Optionally, the polymer also has a carboxyl content of 0 to about 15% by weight. When the polymer contains carboxyl groups, the carboxyl content is preferably in the range of about 1 to about 15%, and most preferably in the range of about 2 to about 10%. Attached carboxyl groups may be neutralized with a metal cation of Groups IIA or IIB as shown in Example 4 below.

When the low molecular weight butadiene polymer is added to the photosensitive compositions of this invention, these results improved mixing and handling and an improvement in the rate of development of the composition. The presence of this optional component also provides softer and more flexible compositions. The low molecular weight polymer may be present in any amount up to about 40% by weight based on the total composition, and preferably about 10 to about 35%.

The photosensitive compositions of this invention practically do not scatter actinic radiation when in the form of thin layers, e.g., less than about 250 mils (6350 μm). In order to secure an essentially transparent mixture, i.e., a nonradiation-scattering mixture, the butadiene/acrylonitrile copolymer and any polymer components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound, or any other constituent, used is therefore limited to those concentrations which do not produce undesired light scatter or haze.

The photosensitive compositions of this invention may also contain a small amount of thermal, addition polymerization inhibitor, e.g., 0.001% to 2.0%, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, beta-naphthol, 2,6-di-tert-butyl-p-cresol, phenothiazine, pyridine, nitrobenzene, dinitrobenzene, the nitroso dimer inhibitor systems described in British Pat. No. 1,453,681, and the bis(substituted amino)sulfides disclosed in U.S. Pat. No. 4,168,981. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocross-linked without removal of the inhibitor. The preferred inhibitors are 2,6-di-tert-butyl-4-methylphenol and p-methoxyphenol.

The oxygen and ozone resistance of photosensitive elements of this invention and printing reliefs made therefrom can be improved by incorporating into the photosensitive composition a suitable amount of compatible well-known antioxidants and/or antiozonants. Antioxidants useful in this invention include: alkylated phenols, e.g., 2,6-di-tert-butyl-4-methylphenol; alkylated bis-phenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octylthio)-1,3,5-triazine; polymerized trimethyldihydroquinone; and dilauryl thiodipropionate.

Antiozonants useful in this invention include: microcrystalline wax and paraffin wax; dibutylthiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl maleate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylic acid copolymer, polyurethanes, polypentadienes, polybutadiene, furfural-derived resins, ethylene/propylene/diene rubber, diethylene glycol ester of rosin and α-methylstyrene/vinyltoluene copolymer. Ozone resistance of the printing relief produced can also be improved by annealing it at elevated temperatures prior to use.

If desired, the photosensitive compositions can also contain immiscible, polymeric or nonpolymeric organic or inorganic fillers or reinforcing agents which are essentially transparent at the wavelengths used for exposure of the photosensitive material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photosensitive layer may also, if desired, include compatible plasticizers to lower the glass transition temperature of the binder and facilitate selective development. The plasticizer may be any of the common plasticizers compatible with the polymeric binders. Among the common plasticizers which may be used are dialkyl phthalates, alkyl phosphates, polyethylene glycol, polyethylene glycol esters, and polyethylene glycol ethers.

The photosensitive compositions of this invention can be prepared in any suitable way by mixing the essential constituents, i.e., (1) the high molecular weight butadiene/acrylonitrile copolymer, (2) the compatible ethylenically unsaturated compound, (3) the free-radical generating system, and (4) the metal-containing compound which will cross-link the carboxyl groups in the copolymer. For example, flowable compositions can be made by mixing them and other desired adjuvants in any order and, if desired, with the aid of a solvent such as chlorinated hydrocarbons, e.g., chloroform, chlorobenzene, trichloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents acetone; lower molecular weight alcohols, e.g., methyl, ethyl and propyl alcohol; and esters, e.g., methyl, ethyl and butyl acetate. The solvent can be removed later by heating the admixture or extruded layer.

Conventional milling and mixing techniques can be used in making these compositions, the particular technique varying with the differences in properties of the respective components. Milling at elevated temperatures with addition of the metal-containing compound last is preferred. The homogeneous, essentially non-radiation-scattering compositions are formed into sheets in any desired manner. For example, solvent-casting, hot pressing, calendering, or extrusion are suitable methods for preparing layers of the desired thickness. It may be desirable to employ a retarder or controller during mixing of the metal-containing compound with the carboxyl-containing binder. Controllers which have been employed in conventional cross-linking of a carboxyl-containing elastomer with a metal oxide include organic acids and anhydrides, silica and boric acid.

The photosensitive elements of this invention can be made by solvent casting or by extruding, calendering or pressing at an elevated temperature of the photosensitive composition into the form of a layer or self-supporting sheet on a suitable casting wheel, belt or platen. The layer or sheet may be laminated to the surface of a suitable permanent substrate or, if necessary, it may be affixed by means of a suitable adhesive, or the solution may be coated directly onto a suitable substrate. The photosensitive elements may have antihalation material beneath the photosensitive layer. For instance, the substrate may contain an antihalation material or have a layer or stratum of such material on its surface. Antihalation layers, e.g., antihalation pigments such as carbon black, manganese dioxide, and various dyes, are particularly useful when highly reflective substrates are used. The elements may be made in the various manners described in U.S. Pat. Nos. 2,760,863, 2,791,504 and 3,024,180. The photosensitive layer itself can serve as the light absorption layer, e.g., when dyes or pigments are included in the photosensitive composition or when the layer is sufficiently thick.

The thickness of the photosensitive layer is a direct function of the thickness desired in the relief image and this will depend on the subject being reproduced and the ultimate use of the relief, e.g., thick soft reliefs are useful for flexographic printing and thin hard reliefs are useful for planographic printing. In general, the thickness of the polymerizable layer will be less than about 300 mils, e.g., it will vary from about 0.5 to about 300 mils (13–7600 $\mu$m) and layers within this range of thickness will be used for the majority of the printing plates.

The photosensitive compositions of this invention may be applied to a wide variety of substrates. By "substrate" is meant any natural or synthetic support, especially one which is capable of existing in a flexible or rigid film or sheet form. Suitable substrates include metals, e.g., steel and aluminum plates, sheets and foils, cellulose paper, fiberboard, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate; polyamides, e.g., polyhexamethylenesebacamide; polyimides, e.g., films as disclosed in U.S. Pat. No. 3,179,634; and polyester amides, e.g., polyhexamethyleneadipamide adipate and the like, or a composite of two or more of these materials. Fillers or reinforcing agents can be present in the synthetic resin or polymer bases such as the various fibers (synthetic, modified, or natural), e.g., cellulosic fibers, for instance, cotton, cellulose acetate, viscose rayon; paper; glass wool; nylon and polyethylene terephthalate. These reinforced bases may be used in laminated form.

Other substrates include copper, alumina-blasted aluminum, oriented polyester film, alumina-blasted oriented polyester film, polyvinylidene chloride-coated oriented polyester film, polyvinyl alcohol-coated paper, cross-linked polyester-coated paper, nylon, glass, heavy paper such as lithographic paper, polypropylene film, silicon wafers, and the like. Various anchor layers disclosed in U.S. Pat. No. 2,760,863 can be used to give strong adherence between the substrate and the photosensitive layer or, in the case of a transparent substrate, preexposure through the substrate to actinic radiation may be useful. The adhesive compositions disclosed in U.S. Pat. No. 3,036,913 are also effective.

The photosensitive compositions of this invention are, in general, solids. They are also, frequently, depending on their composition, somewhat tacky on the surface. This latter property is of advantage in that compositions adhere of themselves to a substrate being used and do not usually require the application of an adhesive to retain them on the substrate, both during photoexposure and development steps and during subsequent use of the insolubilized material as a printing plate. The elements of the invention may be provided with a transparent flexible cover sheet such as a thin film of polystyrene, polyethylene, polypropylene, polyethylene terephthalate or other strippable material on the side of the photosensitive layer remote from the substrate to prevent contamination of or damage to the photosensitive layer during storage or manipulation. The elements may also be provided with a thin, hard, flexible, solvent-soluble layer, such as a flexible, polymeric film or layer, e.g., of a polyamide or a copolymer of ethylene and vinyl acetate, or the known type of mold-release agents, e.g., certain commercially available silicones. Preferred are polymers which are soluble in the aqueous solutions normally used for development, e.g., poly(vinyl alcohol). This layer is interposed between the cover sheet, when present, and the upper surface of the photosensitive layer when it is desired to protect for reuse an image-bearing negative or transparency superposed thereon or to improve contact or alignment with the photosensitive surface. If desired, the photosensitive element can also have on the reverse surface of the substrate a pressure-sensitive adhesive layer provided with a protective strippable layer. Upon removal of the latter, the element can be processed onto or otherwise adhered to a permanent substrate, e.g., a printing block or metal plate.

Printing reliefs can be made in accordance with this invention by exposing to actinic radiation selected portions of a photosensitive layer of an element described above, for example, through a process transparency, i.e., an image-bearing transparency or stencil having areas essentially transparent to actinic radiation and of substantially uniform optical density and areas opaque to actinic radiation and of substantially uniform optical density until substantial addition-polymerization or photocross-linking takes place. During the addition-polymerization or cross-linking, the butadiene copolymer/ethylenically unsaturated compound composition is converted to the insoluble state in the radiation-exposed portions of the layer, with no significant polymerization or cross-linking taking place in the unexposed portions or areas of the layer. The unexposed portions of the layer are removed by means of a solvent for the butadiene/acrylonitrile copolymer. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer underneath the clear portions of the transparency. This results in a polymeric relief having its greatest width at the bottom of the photopolymerizable layer, i.e., a frustum, the top surface of the relief being the dimensions of the clear area.

Inasmuch as the free-radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, lasers, electron flash units and photographic flood lamps. Electron accelerators and electron beam sources through an appropriate mask may also be used. Of these, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 60 inches (3.8–153 cm) from the photosensitive composition. Exposure temperatures are not particularly critical, but it is preferred to operate at about ambient temperatures or slightly higher, i.e., about 20° to about 35° C.

After exposure, the image may be developed by washing with a suitable solvent. The solvent liquid should have good solvent or swelling action on the butadiene copolymer/ethylenically unsaturated compound composition and little action on the insolubilized image or upon the substrate material, antihalation layer, or anchor layer, in the period required to remove the nonpolymerized or noncross-linked portions.

Although organic solvents and solvent mixtures may be employed for development solvents an aqueous base to which a water-soluble organic solvent may be added. Suitable specific solvent mixtures include sodium hydroxide/isopropyl alcohol/water, sodium carbonate/water, sodium carbonate/2-butoxyethanol/water, sodium borate/2-butoxyethanol/water, sodium silicate/2-butoxyethanol/glycerol/water, and sodium carbonate/2-(2-butoxyethoxy)ethanol/water. The particular solvent combination chosen will depend upon the carboxyl-content of the photosensitive composition, the extent of neutralization of the carboxyl groups, and the properties and amounts of the binder employed. Other aqueous solvent combinations which may be employed are described in U.S. Pat. No. 3,796,602. These aqueous base/water-soluble organic solvent combinations are preferred because of their low cost, nonflammability and reduced toxicity.

Solvent development may be carried out at about 25° C., but best results are obtained when the solvent is warm, e.g., 30°–60° C. Development time can be varied and preferably is in the range of 5–25 minutes.

In the development step where the relief is formed, the solvent may be applied in any convenient manner, as by pouring, immersion, spraying, or roller application. Brushing is preferred since it aids in the removal of the unpolymerized or uncross-linked portions of the composition.

Alternatively, depending upon application, development of the image after exposure may be carried out by toning, i.e., dusting with a fine pigment which selectively adheres to the tacky unpolymerized areas, use of peel apart transfer, pressure transfer, and differential adhesion of the exposed versus unexposed areas.

The printing reliefs made in accordance with this invention can be used in all classes of printing, but are most applicable to those classes of printing wherein a distinct difference of height between printing and nonprinting areas is required, and particularly to the flexographic printing class wherein a resilient print area is required, e.g., for printing on deformable printing surfaces. These classes include those wherein the ink is carried by the raised portion of the relief such as in dry-offset printing, ordinary letter-press printing, the latter requiring greater height differences between printing and nonprinting areas, and those wherein the ink is carried by the recessed portions of the relief such as in gravure and intaglio printing, e.g., line and inverted half-tone. The plates are also useful for multi-color printing.

The photosensitive compositions of this invention are also useful in the preparation of photo-resists for etching, gravure, planograph plates, semiconductor wafers, and screens for "silk screen" printing or as stencils. The compositions can be coated onto printing cylinders, e.g., plastic or metal cylinders, or attached thereon as photosensitive elastomeric layers.

The photosensitive compositions are suitable for other purposes, in addition to the printing uses described above, in which readily insolubilized, solid, addition polymerizable compositions are useful, e.g., for making ornamental plaques or for producing ornamental effects; for making patterns for automatic engraving machines, foundry molds, cutting and stamping dyes; for name stamps; for relief maps; for gaskets; as rapid cure coatings, e.g., on film base, on rollers, inside tanks; in the preparation of printed and microelectronic circuits; for affixing phosphors to surfaces to provide color television screens; and in the preparation of other plastic or elastomeric articles.

The following are illustrative examples of the invention in which all parts and percentages are by weight and all degrees are Celsius unless otherwise stated.

The photosensitive compositions were generally prepared by mixing the ingredients under yellow light on a rubber mill at 100°-120°. The order of mixing was usually as follows:
(1) high molecular weight copolymer binder;
(2) any optional component, if employed, including any low molecular weight butadiene polymer;
(3) ethylenically unsaturated compound and free-radical generating system, usually premixed; and
(4) organometallic compound.

The photosensitive compositions were prepared by pressing the milled compositions, supported on a 5-mil (127-μm) vinylidene chloride/vinyl chloride copolymer-subbed, oriented polyester film substrate or a 5-mil flame-treated oriented polyester film substrate, at 100°-120° and 15,000-20,000 psi (103,000-138,000 kPa) using 65-mil (1650-μm) or 112-mil (2840-μm) metal shims to control plate thickness. A polytetrafluoroethylene cover sheet was employed. A Pasadena press was employed for preparation of the plates. The polytetrafluoroethylene cover sheet was replaced with a 1-mil (25.4-μm) thick film of polypropylene before exposure.

The 65-mil (1650-μm) thick plate samples were exposed for 30 minutes in a vacuum frame at about 250 mm mercury pressure to a Black Light Eastern (BLE) Spectroline exposure source, Model XX15 (0.76 amp), containing two 15 W lamps (G.E. F15T8-BL) held 2 inches (5.1 cm) from the sample, unless otherwise specified. A sheet of standard antihalation material was placed on the underside of the samples during exposure. Standard negative resolution targets were used as process transparencies in contact with the photosensitive compositions. After exposure, the polypropylene cover sheet was removed and the images were developed mechanically by brushing the plate surfaces for 20 min at about 55° in a solution of 0.8% sodium carbonate in 2-(2-butoxyethoxy)ethanol/water (1/9 w/w). The development was conducted with a single-brush prototype of a commercial processor (Cyrel ® Plate Processor; Model No. 2-1824; Du Pont Co.) which was modified with a heater to allow operation at elevated temperatures. After development, the plates were air-dried for 30 min at about 65°, further dried at 25° overnight, and finally post-exposed for 1 hr in air with the lamp source described. Plate clarity, flexibility, relief height and image quality were assessed for these plates.

The 112-mil (2840-μm) thick plate samples were exposed to radiation from a bank of four closely spaced ultraviolet lamps (Sylvania blacklight very high output lamps, FR-48T12-B1-VHO-180, 48 W) at a distance of 6 inches (15.2 cm) using the following procedure: (1) the black of the plate was first exposed through the substrate for 4 min in air (back-exposure); (2) the top of the plate was exposed for 15 min in vacuo (blanket exposure); (3) the top of the plate was postexposed in air for 15 min, after development and drying in the usual way. The development (for 10 min) and drying steps were conducted in this case to expose the plates to these processing steps prior to testing. The plates were examined for ink solvent resistance, hardness and resilience as described below.

The ink solvent resistance was determined by immersing 1in.×2 in. (2.5–5.1 cm) samples of the finished plates in various test solvents or solvent mixtures (in which proportions are by volume), and the percent volume swell after 24 hr was measured. Volume swell was calculated from the weight of sample in air (A) and weight in a buoyant liquid (L), usually 2-propanol, by the equation:

Percent Volume
Swell = $[(W_{2A}-W_{2L})/(W_{1A}-W_{1L})-1]100$ where $W_1$ and $W_2$ represent the sample weights before and after immersion, respectively. The percent weight depletion caused by solvent extraction was subsequently determined by reweighing the test samples after drying them in air at room temperature for at least seven days.

Hardness was measured using a Shore A Durometer with the plate sample placed on a hard surface. Resilience was subjectively determined by pressing the sample with a thin object (e.g., spatula, thumbnail), then releasing and rubbing the thin object over the depression until fully recovered. A 10 sec recovery was called poor. Impact resilience was measured as described in ASTM D2632 using the Shore Resiliometer, Model SR-1.

EXAMPLE 1

The following photosensitive composition was blended by milling at 100° following the general procedure described:
70 parts of Hycar ® 1072-CG
28 parts of 1,6-hexanediol diacrylate
2 parts of benzoin isobutyl ether
7.88 parts of zinc acetylacetonate dihydrate.

Hycar ® 1072-CG (B. F. Goodrich Company) is a high molecular weight (average Mooney Viscosity=45:$\overline{Mn}$~31,000) carboxylated butadiene/acrylonitrile copolymer (~27% acrylonitrile content; carboxyl content~3.38% based on an EPHR value of 0.075).

In this experiment, the zinc compound was first blended with the polymer and the other ingredients were then added as a solution. Addition of the zinc compound caused the melted polymer sheet to change into a tough, elastic band due to formation of ionic crosslinks.

After milling, the slab was pressed into plates at 110°/20,000 psi (138,000 kPa) by the general procedure described. The 65-mil (1650-μm) plate was exposed to radiation for 30 min through a line process negative, and the exposed image was developed by the general procedure described. A relief image was obtained corresponding to the transparent areas of the process transparency. The plate after development was virtually unswelled, nontacky and showed very little image distortion because of the high elastic recovery of the plate. A 13.5-mil (340-μm) relief was measured after the plate was dried and post-exposed as described. The clear, nontacky plate was characterized by good flexibility and excellent image sharpness in the raised relief areas. It could be bent through a 180° angle without cracking of the image. Plate properties were further assessed as described below.

The 112-mil (2840-[m) plate was exposed, developed and post-exposed by the general procedure described. The plate exhibited good resilience; impact resilience of 37%; and a Shore A Durometer hardness of 70. It was found to have satisfactory solvent resistance for use with water-, alcohol- and hydrocarbon-based inks as indicated by the 24-hr solvent immersion test data summarized in Table I.

TABLE I

| Solvent | 24-Hr Immersion | |
|---|---|---|
| | % Vol. Swell | % Wt. Depletion |
| Water/ethanol/morpholine (45/50/5) | 1.3 | 0.8 |
| Ethanol | 3.3 | 0.08 |
| n-Heptane | 0.6 | 0.35 |
| Ethanol/n-heptane (50/50) | 10.0 | +0.18 (weight gain) |

EXAMPLE 2

The following photosensitive composition was blended by milling at 120° following the general procedure.
70 parts of Hycar ® 1072-CG
28 parts of 1,6-hexanediol diacrylate
1 part of benzil dimethyl ketal
7.88 parts of zinc acetylacetonate dihydrate.

After milling, plates were formed and processed as in Example 1 by the general procedure described. The plates showed properties similar to those described for the plates in Example 1; relief, 20.5 mil (520 μm); Shore A Durometer hardness, 64; resilience, good; impact resilience, 48%. The ink solvent resistance measured on the 112-mil (2840-μm) plate is summarized in Table II.

TABLE II

| Solvent | 24 Hr Immersion | |
|---|---|---|
| | % Vol. Swell | % Wt. Depletion |
| Ethanol | 4.8 | 0.21 |
| n-Heptane | 1.1 | 0.50 |
| Ethanol/n-heptane (50/50) | 12.5 | 0.21 |

EXAMPLE 3

This example demonstrates the improvement in physical properties obtained with a composition of the invention compared with a control without metal ion cross-links. Following the general procedure, photosensitive compositions were blended by milling at 110°, as follows:

Formulation A
70 parts of Hycar ® 1072-CG
28 parts of 1,6-hexanediol diacrylate
1 part of benzil dimethyl ketal
6.92 parts of zinc acetylacetonate Formulation B (Control)
70 parts of Hycar ® 1072-CG
28 parts of 1,6-hexanediol diacrylate
1 part of benzil dimethyl ketal Plates were pressed from the slabs by the general procedure described above. The unexposed plates of the invention (A) were relatively hard, tough and resilient compared with the soft, tacky, and low strength of control plates B.
Shore A hardness (Formulation A), 41
Shore A hardness (Formulation B), 15.

The plates were exposed to radiation and developed by the general procedures described above. The developed plates of the invention were nontacky, had a smooth background (developed areas), and showed no visible distortion in the imaged areas. The control plates, by contrast, were soft, sticky, uneven in the developed areas, and the fine lines of the imaged areas were distorted.

The developed plates were post-exposed, and the solvent resistances were measured. The plates of the invention were nontacky, and the control plates were slightly tacky. Although the clear, finished plates were comparable in hardness, resilience and relief, the control plates were inferior to the plates of the invention in solvent resistance in all solvents tested (Table III).
Plate A: Shore A hardness, 68, Resilience, good; relief, 19.5 mils (495 μm); impact resilience, 25.
Plate B (Control): Shore A hardness, 70; resilence, good-excellent; relief, 19.0 mils (483 μm); impact resilience, 20.

TABLE III

| | 24-Hr Immersion | | | |
|---|---|---|---|---|
| | % Vol. Swell | | % Wt. Depletion | |
| Solvent | Plate A | Plate B (Control) | Plate A | Plate B (Control) |
| Water/ethanol/morpholine (50/45/5) | 1.3[1] | 3.3 | 0.8[1] | 0.2 |
| Ethanol | 4.9 | 11.7 | +0.6 | +1.0 |
| n-Heptane | 1.1 | 1.8 | 0.2 | 0.5 |
| Ethanol/n-heptane (50/50) | 9.9 | 19.3 | +2.0 | +1.9 |
| Ethanol/n-heptane/ethyl acetate (60/25/15) | 22.3[1] | 40.2 | 0[1] | +1.5 |
| Ethanol/ethyl acetate (85/15) | 15.3[1] | 27.6 | 0.6[1] | +1.9 |
| 2-(Ethoxyethanol) | 14.7[1] | 31.6 | 2.6[1] | +4.9 |

[1]These values were obtained on the plate of Example 1.

EXAMPLE 4

This example illustrates the addition of an optional component, i.e., a low molecular weight carboxylated butadiene/acrylonitrile copolymer, to a composition of the invention. Following the general procedure, photosensitive compositions were blended by milling at 110°, as follows:

Formulation A
60 parts of Hycar ® 1072-CG
20 parts of Hycar ® CTBNX (1300 X 9) low molecular weight copolymer -continued 19 parts of 1,6-hexanediol diacrylate
1 part of benzil dimethyl ketal
7.91 parts of zinc acetylacetonate
Formulation B (Control)
60 parts of Hycar ® 1072-CG
20 parts of Hycar ® CTBNX (1300 X 9)
19 parts of 1,6-hexanediol diacrylate
1 part of benzil dimethyl ketal Hycar ® CTBNX (1300×9) (B. F. Goodrich Company) is a low molecular weight ($\overline{Mn}$~3,400) liquid butadiene/acrylonitrile copolymer (~18% acrylonitrile content) containing terminal and pendant carboxyl groups (EPHR=0.072; 3.24% carboxyl content).

After milling, plates were pressed from the slabs by the general procedure described above. The physical properties of Plates A and B (Control) differed from one another qualitatively as described for the Plates A and B (Control) of Example 3. However, both unexposed Plates A and B of the instant Example were softer (Plate A: Shore A hardness, 33. Plate B: Shore A hardness, 15.) because of the addition of the low molecular weight copolymer, and they were more readily developed in the semiaqueous developer solution employed.

The plates were exposed to radiation, developed, and post-exposed by the general procedures described, and physical properties were determined.

Plate A: Shore A hardness, 58; resilience, good-excellent; relief, 25.0 mils (635 μm); impact resilience, 29.

Plate B (Control): Shore A hardness, 53; resilience, excellent; relief, 32.0 mils (813 μm); impact resilience, 19.

The solvent resistance data are summarized in Table IV. The plates of the invention were superior to the control plates in all solvents tested.

TABLE IV

| | 24-Hr Immersion | | | |
|---|---|---|---|---|
| | % Vol. Swell | | % Wt. Depletion | |
| Solvent | Plate A | Plate B (Control) | Plate A | Plate B (Control) |
| Water/ethanol/morpholine (50/45/5) | 1.3 | 5.1 | 0.7 | +0.1 |
| Ethanol | 6.2 | 12.9 | 0.8 | 0.7 |
| n-Heptane | 2.5 | 3.7 | 0.7 | 0.4 |
| Ethanol/n-heptane (50/50) | 18.8 | 27.0 | 1.1 | 0.8 |
| Ethanol/n-heptane/ethyl acetate (60/25/15) | 32.5 | 48.3 | 0.5 | 1.2 |
| Ethanol/ethyl acetate | 20.2 | 31.5 | +1.5 | 0.8 |
| Ethanol/ethyl acetate (85/15) | 20.2 | 31.5 | +1.5 | 0.8 |
| 2-(Ethoxyethanol) | 24.8 | 39.5 | 2.4 | 3.5 |

EXAMPLES 5–7

Following the general procedure, photosensitive compositions which included the low molecular weight compounds shown in the second column of Table V were blended by milling, as follows:
74 parts of Hycar ® 1072-CG
10 parts of low molecular weight compound of Table V
25 parts of 1,6-hexanediol diacrylate
1 part of benzil dimethyl ketal
7.38 parts of zinc acetylacetonate Plates were pressed from the slabs, and the plates were exposed and developed by the general procedures described above. Physical properties of the post-exposed plates are summarized in Table V. The clear, flexible plates exhibited imaging characteristics similar to those of the plate of Example 1.

TABLE V

| Ex. | Low Molecular Weight Compound | Shore A Hardness[1] | Relief, (μm) | Impact Resilience | % Vol. Swell After 24 Hr Immersion[2] | | |
|---|---|---|---|---|---|---|---|
| | | | | | A | B | C |
| 5 | Isostearic Acid | 56 (28) | 458 | 32 | 8.1 | 1.7 | 20.5 |
| 6 | Hycar ® 1312[3] | 60 (40) | 458 | 27 | 6.6 | 1.5 | 15.0 |
| 7 | Dioctyl phthalate | 60 (35) | 305 | 28 | 6.0 | 2.1 | 15.2 |

[1] Number in parentheses is hardness value for corresponding unexposed plate.
[2] A = ethanol; B = n-heptane; C = ethanol/n-heptane (50/50).
[3] Hycar ® 1312 (B. F. Goodrich Company) is a low molecular weight ($\overline{Mn}$ ~ 1200) liquid butadiene/acrylonitrile copolymer (33% acrylonitrile content).

EXAMPLE 8

This example illustrates neutralization of approximately one-half of the available carboxyl groups of the binder with zinc cations. The following photosensitive composition was blended by milling at 110° following the general procedure:
70 parts of Hycar ® 1072-CG
28 parts of 1,6-hexanediol diacrylate
1 part of benzil dimethyl ketal
3.94 parts of zinc acetylacetonate dihydrate.

Plates were pressed from the slab, and the plates were exposed and developed by the general procedures described. The plates exhibited higher strength, less tackiness and improved solvent resistance relative to plates obtained from the corresponding control composition of Example 3.

The post-exposed plates exhibited the following physical properties. Solvent resistance data are summarized in Table VI.
Shore A hardness, 72 (unexposed plate, 33)
Relief, 13.5 mils (343 μm)
Resilience, fair
Impact resilience, 20.

TABLE VI

| | 24 Hr Immerison | |
|---|---|---|
| Solvent | % Vol. Swell | % Wt. Depletion |
| Ethanol | 7.3 | +1.4 |
| n-Heptane | 1.9 | 0.1 |
| Ethanol/n-heptane (50/50) | 14.8 | +2.8 |

EXAMPLES 9–13

Following the general procedure, photosensitive compositions which included the ethylenically unsaturated compound specified in Table VII were blended by milling, as follows:

Examples 9–10
70 parts of Hycar ® 1072-CG
28 parts of ethylenically unsaturated compound
1 part of benzil dimethyl ketal
7.88 parts of zinc acetylacetonate dihydrate.
Examples 11–13
74 parts of Hycar ® 1072-CG
25 parts of ethylenically unsaturated compound
1 part of benzil dimethyl ketal
7.38 parts of zinc acetylacetonate Plates were pressed from the slabs, and the plates were exposed and developed by the general procedures described. Physical property data of the post-exposed plates are summarized in Table VII. The clear, flexible plates possessed imaging characteristics similar to those of the plate of Example 1.

TABLE VII

| Example | Ethylenically Unsaturated Compound | Shore A Hardness[1] | | Relief (μm) |
|---|---|---|---|---|
| 9 | 14 Parts 1,6-hexanediol diacrylate + 14 parts Hycar ® VTBNX (1300 × 19)[3] | 55 | (45) | 470 |
| 10 | Triethylene glycol dimethacrylate | 75 | (45) | 458 |
| 11 | Poly(ethylene glycol) diacrylate | 61 | (42) | 318 |
| 12 | 1,10-Decanediol diacrylate | 64 | (36) | 424 |
| 13 | 5 Parts trimethylolpropane triacrylate + 20 parts Hycar ® VTBNX (1300 × 19)[3] | 57 | (46) | 280 |

| Example | Ethylenically Unsaturated Compound | Impact Resilience | % Vol. Swell 24 Hr Immersion[2] | | |
|---|---|---|---|---|---|
| | | | A | B | C |
| 9 | 14 Parts 1,6-hexanediol diacrylate + 14 parts Hycar ® VTBNX (1300 × 19)[3] | 33 | 6.4 | 2.2 | 17.5 |
| 10 | Triethylene glycol dimethacrylate | 28 | 5.0 | 2.1 | 12.4 |
| 11 | Poly(ethylene glycol) diacrylate | 20 | 6.4 | 0.8 | 11.4 |
| 12 | 1,10-Decanediol diacrylate | 33 | 5.2 | 1.6 | 11.9 |
| 13 | 5 Parts trimethylolpropane triacrylate + 20 parts Hycar ® VTBNX (1300 × 19)[3] | 18 | 6.2 | 2.7 | 16.6 |

[1]Number in parentheses is hardness value for corresponding unexposed plate.
[2]A = ethanol; B = n-heptane; C = ethanol/n-heptane (50/50).
[3]Hycar ® VTBNX (1300 × 19) (B. F. Goodrich Company) is a low molecular weight (Brookfield Viscosity = 490,000 cps at 27°, $\overline{M}n \sim$ 3000–4000) liquid butadiene/acrylonitrile copolymer (~16–17% acrylonitrile) containing pendant and terminal vinyl groups (EPHR vinyl group content = 0.07).

EXAMPLES 14–17

These examples illustrate the use of magnesium and calcium ions to form metal ion cross-links. Following the general procedure, photosensitive compositions which included the ethylenically unsaturated compound specified in Table VIII were blended by milling at 110°, as follows:

Examples 14 and 15
70 parts of Hycar ® 1072-CG
28 parts of ethylenically unsaturated compound
1 part of benzil dimethyl ketal
5.85 parts of magnesium acetylacetonate dihydrate Examples 16 and 17
70 parts of Hycar ® 1072-CG
28 parts of ethylenically unsaturated compound
1 part of benzil dimethyl ketal
6.27 parts of calcium acetylacetonate Plates were pressed from the slabs, and the plates were exposed and developed by the general procedures described. Physical property data of the post-exposed plates are summarized in Table VIII. The clear flexible plates possessed imaging characteristics similar to those of the plates of Example 1; however, the background areas were generally less smooth for these plates. The plates could be bent through a 180° angle without cracking of the images.

TABLE VIII

| Example | Ethylenically Unsaturated Compound | Shore A Hardness[1] | | Relief (μm) |
|---|---|---|---|---|
| 14 | 1,6-Hexanediol diacrylate | 72 | (40) | 463 |
| 15 | 14 Parts 1,6-hexanediol diacrylate + 14 parts Hycar ® VTBNX (1300 × 19) | 68 | (45) | 399 |
| 16 | 1,6-Hexanediol diacrylate | 75 | (49) | 419 |
| 17 | 14 Parts 1,6-hexanediol diacrylate + 14 parts Hycar ® VTBNX (1300 × 19) | 60 | (42) | 394 |

| Example | Ethylenically Unsaturated Compound | Impact Resilience | % Vol. Swell 24 Hr Immersion[2] | | |
|---|---|---|---|---|---|
| | | | A | B | C |
| 14 | 1,6-Hexanediol diacrylate | 32 | 6.4 | 0.7 | 13.5 |
| 15 | 14 Parts 1,6-hexanediol diacrylate + 14 parts Hycar ® VTBNX (1300 × 19) | 24 | 8.1 | 3.0 | 19.2 |
| 16 | 1,6-Hexanediol diacrylate | 31 | 5.2 | 1.4 | 12.1 |
| 17 | 14 Parts 1,6-hexanediol diacrylate + 14 parts Hycar ® VTBNX (1300 × 19) | 28 | 6.4 | 1.8 | 16.7 |

[1]Number in parentheses is hardness value for corresponding unexposed plate.
[2]A = ethanol; B = heptane; C = ethanol/n-heptane (50/50).

EXAMPLE 18

This example illustrates the use of zinc acetate dihydrate to form the metal ion cross-links. The following photosensitive composition was blended by milling at 110° following the general procedure:
56 parts of Hycar ® 1072-CG,
28 parts of Hycar ® CTBNX (1300×9) low molecular weight copolymer,
15 parts of 1,6-hexanediol diacrylate,
1 part of benzil dimethyl ketal,
6.8 parts of zinc acetate dihydrate.
The composition also contained 0.1 part of a thermal inhibitor source, 1,4,4-trimethyl-2,3-diazabicyclo-[3.2.2]non-2-ene-N,N'-dioxide, which was premixed with the Hycar ® CTBNX (1300×9) prior to addition to the mill.

After milling, the slab was pressed into plates at 110°/20,000 psi by the general procedure described. Both plates in this example were exposed to radiation by the bank of lights described for the 112-mil plates. The 65-mil plate was exposed for 15 minutes (top blanket exposure) and the 112-mil plate was exposed for 4 minutes (back-exposure) and 15 minutes (top exposure). These plates were subsequently postexposed for 15 minutes (65-mil plate) and 10 minutes (112-mil plate) respectively after the development and drying steps.

The plates showed properties which generally resembled those described for the plates of Example 4A. The 65-mil plate was characterized by good flexibility and excellent image sharpness in the raised relief area: relief, 17.0 mils (432 μm). The 112-mil plate exhibited a Shore A durometer hardness of 60 and an impact resilience of 20. The ink solvent resistance data measured on the 112-mil plate are summarized in Table IX.

TABLE IX

| Solvent | 24 Hr. Immersion | |
|---|---|---|
| | % Vol. Swell | % Wt. Depletion |
| Ethanol | 7.8 | + 0.82 |
| n-Heptane | 6.9 | + 0.63 |
| Ethanol/n-heptane (50/50) | 24.4 | + 2.05 |

EXAMPLES 19–23

Following the general procedure, photosensitive compositions which included the high molecular weight carboxylated butadiene/acrylonitrile copolymers listed in Table X were blended by milling at 110°, as follows:

56 parts of carboxylated butadiene/acrylonitrile copolymer,
28 parts of Hycar ® CTBNX (1300×9) low molecular weight copolymer, Example 4,
15 parts of 1,6-hexanediol diacrylate,
1 part of benzil dimethyl ketal,
zinc acetylacetonate as shown in Table X.

Each composition also contained 0.1 part of 1,4,4-trimethyl-2,3-diazabicyclo[3.2.2]non-2-ene-N,N'-dioxide which was premixed with the Hycar ® CTBNX (1300×9) before addition to the mill.

Each of the carboxylated butadiene/acrylonitrile copolymers was pre-conditioned by twenty passes through the unheated, tightly nipped rollers of the mill.

Plates were pressed from the slab and the plates were exposed and developed by the procedure described in Example 18, except that the 112-mil plates were postexposed for 15 minutes. Properties of the postexposed plates are summarized in Table X. The clear, flexible, 65-mil plates possessed imaging characteristics similar to those of the plate of Example 1.

TABLE X

| Ex. | Carboxylated Butadiene/Acrylonitrile Copolymer | Zinc Acetylacetonate, (parts) | Shore A Hardness[1] | Relief (μm) |
|---|---|---|---|---|
| 19 | Hycar ® 1072-CG | 8.17 | 63 (30) | 508 |
| 20 | Krynac ® 221 | 8.44 | 68 (34) | 280 |
| 21 | Krynac ® 211 | 10.00 | 60 (34) | 685 |
| 22 | Krynac ® 211 HV | 10.00 | 65 (37) | 635 |
| 23 | Hycar ® 1072-CG Dusted Crumb | 7.91 | 63 (30) | 508 |

| Ex. | Carboxylated Butadiene/Acrylonitrile Copolymer | Impact Resilience | % Vol. Swell 24 Hr Immersion[2] | | |
|---|---|---|---|---|---|
| | | | A | B | C |
| 19 | Hycar ® 1072-CG | 27 | 6.1 | 6.2 | 21.5 |
| 20 | Krynac ® 221 | 24 | 5.9 | 4.8 | 19.6 |
| 21 | Krynac ® 211 | 19 | 7.2 | 4.5 | 22.3 |
| 22 | Krynac ® 211 HV | 21 | 6.7 | 4.6 | 20.2 |
| 23 | Hycar ® 1072-CG Dusted Crumb | 27 | 6.3 | 6.5 | 22.1 |

[1]Number in parentheses is hardness value for corresponding unexposed plate.
[2]A = ethanol; B = n-heptane; C = ethanol/n-heptane (50/50).

The carboxylated butadiene/acrylonitrile copolymers of Examples 20–22 have varying carboxyl contents as follows:

Krynac ® 221 (Polysar, Inc.): Mooney Viscosity=50; acrylonitrile content, ~25–30%; carboxyl content, ~3.5%.
Krynac ® 211 (Polysar, Inc.): Mooney Viscosity=55; acrylonitrile content, ~31–34%; carboxyl content, ~4.5%.
Krynac ® 211 HV (Polysar, Inc.): Mooney Viscosity=75; acrylonitrile content, ~31–34%; carboxyl content, ~4.5%.

Hycar ® 1072-CG dusted crumb was obtained from B. F. Goodrich Company. It was prepared by cutting Hycar ® 1072-CG into ⅜ in pieces and dusting with 16 weight percent of an 85/15 vinyl chloride/vinyl acetate copolymer dust (VYHH) obtained from Union Carbide Corp. The crumb rubber was sifted through a 30-mesh screen prior to use which reduced the amount of copolymer dust to ~8%.

EXAMPLES 24–28

Following the general procedure, photosensitive compositions which included the low molecular weight butadiene/acrylonitrile copolymers of Table XI were blended by milling at 110°, as follows:

65 parts of Hycar ® 1072-CG Dusted Crumb, Example 23,
24 parts of low molecular weight copolymer of Table XI,
10 parts of 1,6-hexanediol diacrylate,
1 part of benzil dimethyl ketal,
zinc acetylacetonate as shown in Table XI,
0.1 part of 1,4,4-trimethyl-2,3-diazabicyclo[3.2.2]non-2-ene-N,N'-dioxide premixed with the low molecular weight copolymer,
1.5 parts of benzoic acid.

The benzoic acid, which was premixed with the low molecular weight copolymer, was added as a reagent for controlling the melt viscosity of the composition.

Plates were pressed from the slabs (110°/20,000 psi) and the plates were exposed to radiation by the bank of lights described for the 112-mil plates for the following times:

65-mil plate: 15 min top blanket exposure, 10 min. post-exposure, after development and drying,
112-mil plate: 1.5 min back-exposure; 15 min top blanket exposure; 10 min post-exposure, after development and drying.

The properties of the postexposed, 112-mil plates are summarized in Table XI. The clear, flexible, 65-mil plates possessed imaging characteristics similar to those of the plates of Example 1.

TABLE XI

| Ex. | Low Molecular Weight Copolymer | Zinc Acetylacetonate (parts) | Shore A2 Hardness[1] | Relief (μm) |
|---|---|---|---|---|
| 24 | Hycar ® CTBNX (1300 × 9), Example 4 | 8.17 | 58 | 432 |
| 25 | Hycar ® 1312 Example 6 | 6.06 | 51 | 330 |
| 26 | 12 parts Hycar ® CTBNX (1300 × 9) + 12 parts Hycar ® 1312 | 7.12 | 54–56 | 407 |
| 27 | 12 parts Hycar ® VTBNX (1300 × 23) + 12 parts Hycar ® 1312 | 6.06 | 54 | 330 |
| 28 | 12 parts Hycar ® CTBNX (1300 × 9) + 12 parts Hycar ® VTBNX (1300 × 23) | 7.12 | 59–60 | 330 |

| Ex. | Low Molecular Weight Copolymer | Impact Resilience | % Vol. Swell 24 Hr Immersion[2] | |
|---|---|---|---|---|
| | | | A | B |
| 24 | Hycar ® CTBNX | 23 | 5.6 | 4.7 |

TABLE XI-continued

| | | | | |
|---|---|---|---|---|
| | (1300 × 9), Example 4 | | | |
| 25 | Hycar ® 1312, Example 6 | 17 | 5.9 | 2.3 |
| 26 | 12 parts Hycar ® CTBNX (1300 × 9) + 12 parts Hycar ® 1312 | 19 | 5.7 | 3.1 |
| 27 | 12 parts Hycar ® VTBNX (1300 × 23) + 12 parts Hycar ® 1312 | 17 | 5.8 | 3.0 |
| 28 | 12 parts Hycar ® CTBNX (1300 × 9) + 12 parts Hycar ® VTBNX (1300 × 23) | 19 | 5.9 | 4.2 |

(1)Hardness was measured with a Shore Conveloader ®, Type A-2 Durometer.
(2)A = ethanol; B = n-heptane.

Hycar ® VTBNX (1300×23) (B. F. Goodrich Company) is an improved shelf-stable version of VTBNX (1300×19), Example 13.

EXAMPLES 29-31

These examples illustrate the use of a carboxylated butadiene/acrylonitrile copolymer crumb dusted with a silica powder. Following the general procedure, photosensitive compositions which included the low molecular weight butadiene/acrylonitrile copolymers of Table XII were blended by milling at 110°, as follows:

61 parts of Hycar ® 1072-CG Dusted Crumb,
28 parts of low molecular weight copolymer of Table XII,
10 parts of 1,6-hexanediol diacrylate,
1 part of benzil dimethyl ketal,
zinc acetylacetonate as shown in Table XII,
0.1 part of 1,4,4-trimethyl-2,3-diazabicyclo[3.2.2]non-2-ene-N,N'-dioxide premixed with the low molecular weight copolymer,
1.5 parts of benzoic acid, premixed with the low molecular weight copolymer.

Hycar ® 1072-CG dusted crumb was obtained from the B. F. Goodrich Company. It was prepared by cutting Hycar ® 1072-CG into ⅜ in pieces and dusting with 3 weight percent of a very fine fumed silica (Cab-o-Sil ® M-5) obtained from Cabot Corporation. The crumb rubber was sifted through a 30-mesh screen prior to use which reduced the amount of dust to ~1 percent.

Plates were prepared from the slab at 130°/20,000 psi, and the plates were exposed and developed by the procedure described in Examples 24–28. The properties of the postexposed, 112-mil plates are summarized in Table XII. The 65-mil plates possessed imaging characteristics similar to those of the plates of Example 1. The plates of these examples were slightly hazy because of the presence of the small amount of dusting agent in the compositions.

TABLE XII

| Ex. | Low Molecular Weight Copolymer | Zinc Acetylacetonate (parts) | Shore A2 Hardness(1) | Relief (μm) |
|---|---|---|---|---|
| 29 | Hycar ® CTBNX (1300 × 9) | 8.56 | 52–53 | 482 |
| 30 | 14 parts Hycar ® CTBNX (1300 × 9) + 14 parts Hycar ® 1312 | 7.25 | 52 | 560 |
| 31 | Hycar ® 1312 | 6.06 | 50–51 | 432 |

| Ex. | Low Molecular Weight Copolymer | Impact Resilience | 24 Hr Immersion(2) % Vol. Swell A | B |
|---|---|---|---|---|
| 29 | Hycar ® CTBNX (1300 × 9) | 27 | 6.5 | 6.6 |
| 30 | 14 parts Hycar ® CTBNX(1300 × 9) + 14 parts Hycar ® 1312 | 26 | 6.4 | 4.7 |
| 31 | Hycar ® 1312 | 21 | 6.8 | 3.6 |

(1)Hardness was measured with a Shore Conveloader ®, Type A-2 Durometer.
(2)A = ethanol; B = n-heptane.

BEST MODE FOR CARRYING OUT THE INVENTION

The best mode contemplated by applicant for carrying out his invention is described by Examples 3, 18 and 24–31.

INDUSTRIAL APPLICABILITY

The industrial applicability of the compositions of the invention is demonstrated by the hardness, impact resilience, high tensile strength, clarity, improved green strength, reduced tackiness and broader ink compatibility of the flexoplates employing as binders the compositions of the invention. Additional advantages to the compositions of the invention include processability in aqueous or semiaqueous basic solution with little swelling, no post-treatment is required, and great latitude during back-exposure.

While I have described the preferred embodiments of my invention, it is to be understood that I do not limit myself to the precise constructions herein disclosed and the right is reserved to all changes and modifications coming within the scope of the invention as defined in the appended claims.

Having thus described my invention, what I claim as new, and desire to secure by Letters Patent is:

1. A photosensitive, elastomeric composition which comprises, based on the total composition,
   (a) 40 to 90% by weight of a high molecular weight butadiene/acrylonitrile copolymer having a number average molecular weight of 20,000 to 75,000, an acrylonitrile content of 10 to 50% by weight, and a carboxyl content of 2 to 15% by weight, 25 to 100 mole % of the carboxyl groups being neutralized with a metal cation of Groups IIA or IIB of the Periodic Table of Elements;
   (b) 2 to 40% by weight of a nongaseous, ethylenically unsaturated compound containing at least one terminal ethylenic group, said compound being capable of forming a high polymer of free-radical initiated, chain-propagating addition polymerization and being compatible with copolymer (a);
   (c) 0.001 to 10% by weight of a radiation-sensitive, free-radical generating system, activatible by actinic radiation which initiates polymerization of the unsaturated compound (b).

2. The photosensitive, elastomeric composition of claim 1 in which high molecular weight copolymer (a) has a carboxyl content of 3 to 10%, 50 to 100 mole % of the carboxyl groups being neutralized with a metal cation selected from the group consisting of calcium, magnesium and zinc.

3. The photosensitive, elastomeric composition of claim 1 in which high molecular weight copolymer (a)

is present in the amount of 50 to 80%, and the unsaturated compound is present in the amount of 10 to 30%.

4. The photosensitive, elastomeric composition of claim 3 in which high molecular weight copolymer (a) has a molecular weight of 25,000 to 50,000, an acrylonitrile content of 15 to 40%, and a carboxyl content of 3 to 10 % by weight.

5. The photosensitive, elastomeric composition of claim 3 to which 10 to 35% by weight of a low molecular weight butadiene polymer, having a molecular weight of 1000 to 5000 and an acrylonitrile content of 10 to 30%, has been added.

6. The photosensitive, elastomeric composition of claim 1 in which high molecular weight copolymer (a) is present in the amount of 50 to 80%, and has a molecular weight of 25,000 to 50,000 and an acrylonitrile content of 15 to 40%, and the free-radical generating system is present in the amount of 0.1 to 5%.

7. The photosensitive, elastomeric composition of claim 1 in which copolymer (a) is a high molecular weight carboxylated butadiene/acrylonitrile copolymer having an acrylonitrile content of 27% and a carboxyl content of 3–4%, practically all the carboxyl groups being neutralized with zinc cations, the ethylenically unsaturated compound is 1,6-hexanediol diacrylate, and the free-radical generating system is benzil dimethyl ketal.

8. The photosensitive, elastomeric composition of claim 7 in which the carboxyl groups are neutralized with zinc cations from zinc acetate.

9. The photosensitive flexographic plate which comprises a substrate having thereon a layer of the photosensitive, elastomeric composition of claim 1 having a thickness of 0.5 to 300 mils.

10. The flexographic plate of claim 9 in which high molecular weight copolymer (a) is present in the amount of 50 to 80%, and has a molecular weight of 25,000 to 50,000, an acrylonitrile content of 15 to 40%, and a carboxyl content of 3 to 10% by weight, 50 to 100 mole % of the carboxyl groups being neutralized with a metal cation of Group IIA or Group IIB.

11. A photosensitive flexographic plate which comprises a substrate having thereon a layer of the photosensitive, elastomeric composition of claim 7 having a thickness of 0.5 to 300 mils.

* * * * *